United States Patent [19]

Iwahashi

[11] Patent Number: 5,022,002

[45] Date of Patent: Jun. 4, 1991

[54] PROGRAMMABLE ROM HAVING A REDUCED NUMBER OF POWER SOURCE TERMINALS

[75] Inventor: Hiroshi Iwahashi, Yokohama, Japan

[73] Assignee: Kabushiki Kaisha Toshiba, Kawasaki, Japan

[21] Appl. No.: 218,403

[22] Filed: Jul. 13, 1988

[30] Foreign Application Priority Data

Jul. 14, 1987 [JP] Japan .................... 62-175056

[51] Int. Cl.[5] .................... G11C 7/00; G11C 11/40
[52] U.S. Cl. .................... 365/185; 365/189.03
[58] Field of Search .................... 365/189.03, 189.09, 365/226, 185, 104, 94, 189.05

[56] References Cited

U.S. PATENT DOCUMENTS

| | | |
|---|---|---|
| 4,365,316 | 12/1982 | Iwahashi et al. . |
| 4,425,632 | 1/1984 | Iwahashi et al. . |
| 4,467,457 | 8/1984 | Iwahashi et al. . |
| 4,506,350 | 3/1985 | Asano et al. . |
| 4,593,203 | 6/1986 | Iwahashi et al. . |
| 4,611,301 | 9/1986 | Iwahashi et al. . |
| 4,613,957 | 9/1986 | Iwahashi . |
| 4,635,232 | 1/1987 | Iwahashi et al. . |
| 4,639,895 | 1/1987 | Iwahashi et al. . |
| 4,667,312 | 5/1987 | Doung et al. .......... 365/185 X |
| 4,677,591 | 6/1987 | Iwahashi . |
| 4,691,123 | 9/1987 | Hashimoto .......... 307/296.5 |
| 4,715,017 | 12/1987 | Iwahashi . |
| 4,775,958 | 10/1988 | Hashimoto .......... 365/185 |
| 4,791,612 | 12/1988 | Yoshida .......... 365/195 X |
| 4,799,195 | 1/1989 | Iwahashi et al. . |
| 4,811,292 | 3/1989 | Watanabe .......... 365/185 |
| 4,870,618 | 9/1989 | Iwahashi .......... 365/189.03 |

Primary Examiner—James W. Moffitt
Attorney, Agent, or Firm—Finnegan, Henderson, Farabow, Garrett, and Dunner

[57] ABSTRACT

A programmable ROM is made up of a power source terminal, an internal power source voltage generator, a memory cell array, a memory cell drive circuit, and a data read-out circuit. The power source terminal receives a power source voltage of 5 V in a read mode, and a power source voltage of 12.5 V in a program mode. The internal power source voltage generator generates an internal power source voltage substantially equal to or lower than 5 V, on the basis of the power source voltage applied to the power source terminal. The memory cell array contains a plurality of memory cells. Each of the memory cells is a MOS transistor with the floating gate structure. The memory cell drive circuit is connected to the power source terminal and the internal power source voltage generator, for receiving a drive power source. The data read-out circuit is connected to the internal power source voltage generator, for receiving a drive power source. The memory drive circuit supplies a read-out voltage of 5 V to the memory cells in a read mode, and a program voltage of 12.5 V in a program mode. The data read-out circuit is driven by the 5 V power source voltage, and reads out data from the memory cells in a read mode.

14 Claims, 4 Drawing Sheets

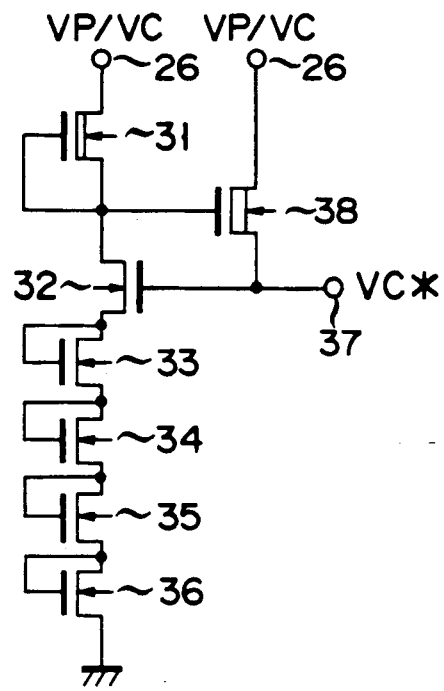
F I G. 2
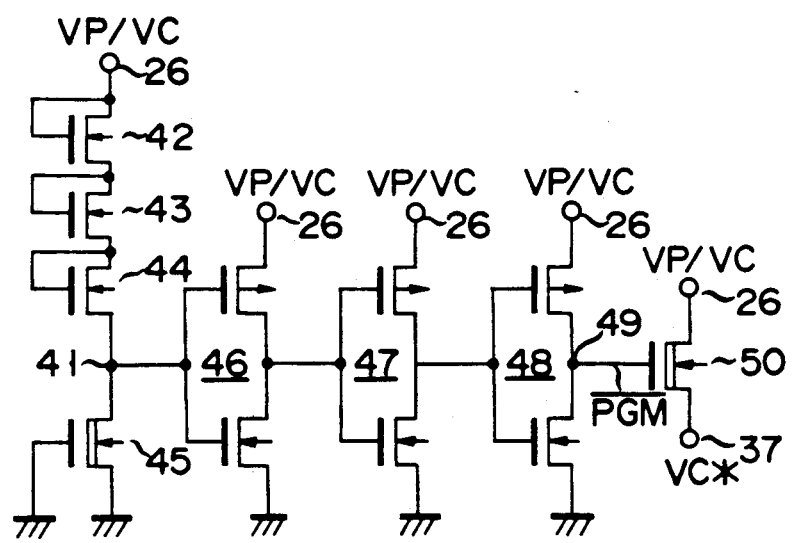
F I G. 3

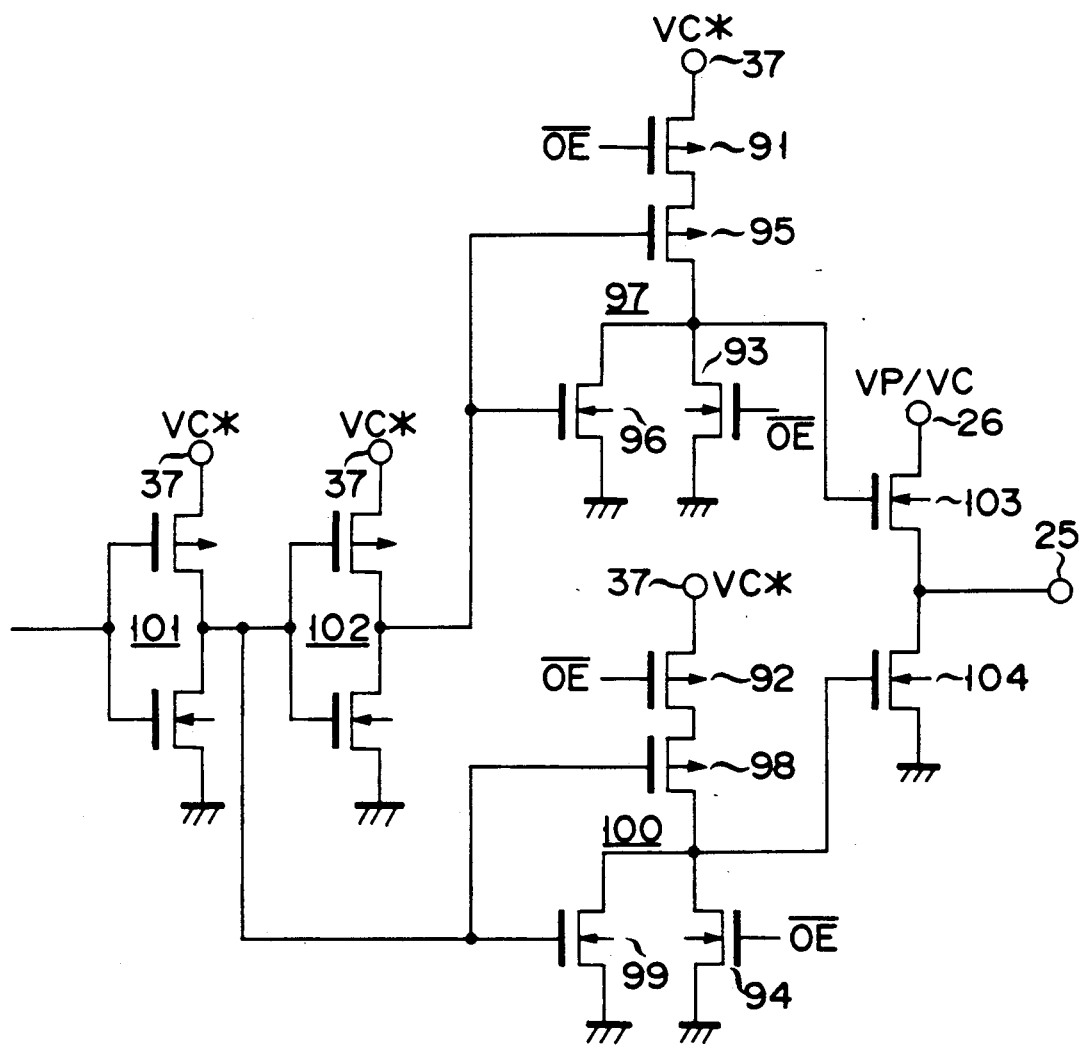
F I G. 6

PROGRAMMABLE ROM HAVING A REDUCED NUMBER OF POWER SOURCE TERMINALS

BACKGROUND OF THE INVENTION

1. Field of the Invention

This invention relates to a programmable ROM for electrically storing data. More particularly, the invention relates to a programmable ROM whose memory cells are floating gate type MOS transistors, and which uses a high voltage to write data into the memory cells, and a low voltage to read data from the memory cells.

2. Description of the Related Art

In general, erasable programmable ROMs (EPROMs) employ floating gate type MOS transistors as memory cells. When such EPROMs are in a read mode, a read voltage of, for example, 5V, is applied to the control gate of the cell transistor, while when in a write mode or a program mode, a write voltage of, for example, 12.5 V, is applied to the control gate and drain of the cell transistor.

The reason for EPROMs needing different voltages for reading data from, and writing data into, the memory cells is as follows:

A programmable ROM has two power source terminals. The first power source terminal continuously receives an external power source voltage of 5 V, and a second power source terminal receives a power source voltage of 5 V when in a read mode, but one of 12.5 V when in a write mode.

The programmable ROM includes a circuit designed for only data-reading operation, such as a sense amplifier, a data output buffer, or the like, and a circuit designed for both data-reading operation and programming operation, such as a column decoder, a row decoder, or the like. The data-reading circuit comprises transistors having a short channel, so that the circuit may operate at a high speed. These short channel type transistors cannot withstand the power source voltage of 12.5 V. Therefore, the power source voltage of 5 V is applied to these transistors, thereby to drive them.

The data-reading and programming circuit has an output buffer section which comprises transistors having a long channel since the circuit must apply a high voltage to the memory cells of the programmable ROM. The output buffer section of the circuit is connected to the second power source terminal. This section is driven by the power source voltage of 5V to read data from the ROM, and by the power source voltage of 12.5 V to write data into the ROM. The other sections of the circuit comprise transistors having a short channel, and are driven by the power source voltage of 5 V.

As has been described, the programmable ROM requires two types of power source voltages, which are applied to the first and second power source terminals, respectively. Therefore, the IC package of this ROM needs an earth pin for earth potential (0 V) and two pins used as the first and second power source terminals. In general, the more pins an IC package has, the greater area the package occupies on the printed circuit board. Hence, the greater the area occupied by the package, the lower the packing density on the board. In other words, the less pins, the better.

The conventional programmable ROM requires more pins than other IC memory devices, such as ordinary ROMs and RAMs. More specifically, it must have a 5V/12.5V power source pin, in addition to those pins which the ordinary ROM and the RAM have, such as address pins, I/O pins, control pins, a ground pin, a 5V power source pin.

SUMMARY OF THE INVENTION

Accordingly, an object of this invention is to provide a programmable ROM which can reduce a required number of pins.

According to this invention, there is provided a programmable ROM which is integrated on a single semiconductor chip and comprises a power source terminal coupled for reception of a power source voltage of a first level, when the programmable ROM is in a read mode, and of a power source voltage of a second level, when the programmable ROM is in a program mode, the second level being higher than the first level; an internal power source voltage generating section for generating an internal power source voltage from the applied power source voltage, even when the power source voltage of the first or second level is applied to the power source terminal, said internal power source voltage being at a level substantially equal to or lower than the first level; a memory cell array including a plurality of memory cells, each of the memory cells being a floating gate type MOS transistor; a memory cell drive section connected to the power source terminal and the internal power source generating section, the memory cell drive section supplying a read-out voltage of a level substantially equal to the first level when the programmable ROM is in a read mode, and supplying a program voltage of a level substantially equal to the second level when the programmable ROM is in a program mode; and a data read-out section which is connected to the internal power source voltage generating section, and which reads out the data from the memory cells when the programmable ROM is in a read mode.

BRIEF DESCRIPTION OF THE DRAWINGS

FIG. 2 is a circuit diagram showing an arrangement of an internal power source voltage generating circuit which can be used in the program ROM shown in FIG. 1;

FIG. 3 is a circuit diagram showing another arrangement of an internal power source voltage generating circuit which can be used in the program ROM shown in FIG. 1;

FIG. 6 is a circuit diagram showing another output buffer contained in the FIG. 1 programmable ROM.

DETAILED DESCRIPTION OF THE PREFERRED EMBODIMENTS

Figure 1:
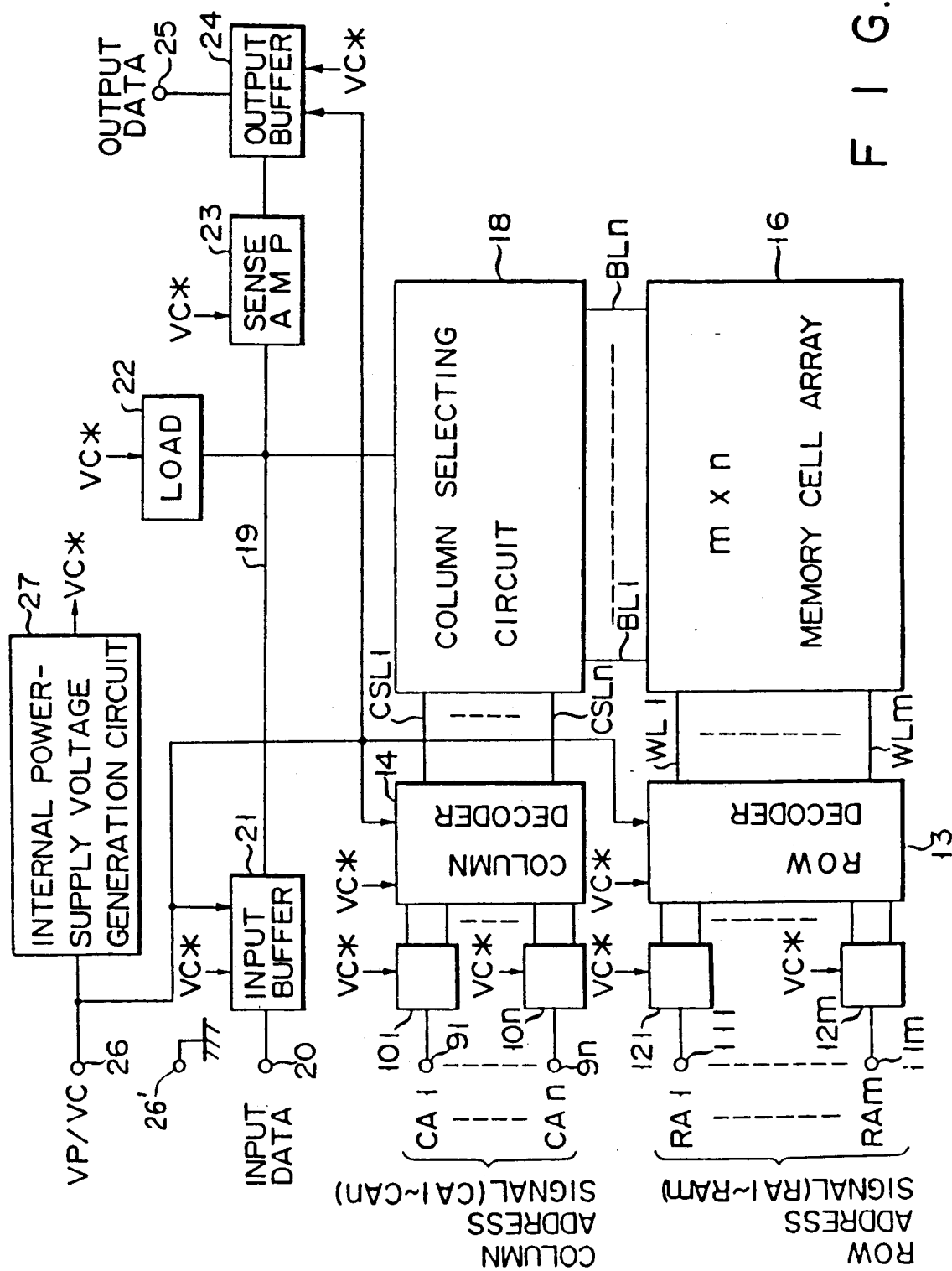
FIG. 1 is a block diagram showing an embodiment of a programmable ROM according to this invention.

FIG. 1 shows in block form an arrangement of a programmable ROM according to an embodiment of this invention. This programmable ROM is integrated into a single semiconductor chip. It is noted here that the power source terminal used is only one terminal denoted as 26, except the earth terminal 26 coupled with earth potential (0 V). When the ROM is in a read mode, power source terminal 26 is externally supplied with power source voltage VC of a first level--for example, 5 V -; when the ROM is in a program mode, terminal 26 receives a power source voltage VP of a second level, which is higher than the first level--for example, 12.5 V.

Internal power source voltage generation circuit 27 is connected to terminal 26. Power source voltage VC or VP is applied to terminal 26. In response to voltage VC or VP, voltage generator 27 generates internal power source voltage VC* which is substantially equal to or lower than voltage VC. Voltage VC* is supplied to all the peripheral circuits, that is, to column address input buffers 101 to 10n, row address input buffers 121 to 12m, row decoder 13, column decoder 14, data input buffer 21, load circuit 22, sense amplifier 23, and data output buffer 24. Of those peripheral circuits, row decoder 13, column decoder 14, and data input buffer 21 are used to supply a write voltage, e.g., 12.5 V, to the memory cells in memory cell array 16. For this reason, their output buffer sections are connected to power source terminal 26. Specifically, row decoder 13, column decoder 14, and data input buffer 21 are driven by internal power source voltage VC*, and also the power source voltage VC or VP externally applied to power source terminal 26.

When the ROM is in a program mode, high power source voltage VP is applied to the output buffer sections of row decoder 13 and column decoder 14, and data input buffer 21. To withstand this high voltage, the output buffer sections comprise transistors having a channel and a gate insulating film which are longer and thicker than those of the transistors forming the other sections which receive power source voltage VC* only.

Usually, there is no need for supplying power source voltage VP to data output buffer 24, in a program mode, because in this mode this buffer does not function. Nevertheless, in the embodiment under discussion, power source voltage VP or VC received at power source terminal 26 is applied to data output buffer 24, too. The reason for this follows. In a read mode, data output buffer 24 must drive a large external load capacitor (not shown) coupled to data output pin 25. To achieve a high speed data read-out operation, the large external load capacitor must be charged or discharged at a high speed. Therefore, it is preferable that the external power source voltage VC with a large current drive ability rather than internal power source voltage VC* be used for the power source voltage to the output buffer section of data output buffer 24. As a matter of course, the internal power voltage VC* alone may be supplied as the drive power source voltage to output buffer 24, if internal power source voltage generator 27 is designed so as to have a large current drive ability.

When the output buffer section of data output buffer 24 is connected to power source terminal 26, the buffer section must be designed so as to withstand the high voltage. To realize this, the output buffer section must be constructed with the transistors with a longer channel, or longer channel and thicker gate insulating film than that of those transistors forming the remaining portion of the output buffer.

The description to follow is elaboration of the respective peripheral circuits contained in this programmable ROM.

Reference is made to FIG. 1, again. Column address signals CA1 to CAn are respectively input through address input terminals 91 to 9n to column address buffers 101 to 10n. Column address buffers 101 to 10n, when receiving column address signals, produce internal column address signals. These internal column address signals are applied to column decoder 14. Row address signals RA1 to RAm are respectively input through address input terminals 111 to 11m to row address buffers 121 to 12m. Row address buffers 121 to 12m, when receiving row address signals, produce internal row address signals. These internal row address signals are applied to row decoder 13.

Memory cell array 16 contains a plurality of memory cells arrayed in a matrix fashion. Each memory cell is constructed with a MOS transistor with the floating gate structure. Specifically, the MOS transistors with the floating gate structure (referred to as cell transistors) are located at the intersections of word lines WL1 to WLm and bit lines BL1 to BLn. The control gates of the cell transistors are coupled with the corresponding word lines, respectively. The drains are respectively coupled with the corresponding bit lines.

Row decoder 13 selects one of word lines WL according to the internal row address signal, and sets it at a high potential. The result is to select the cell transistors connected to the selected word line in memory cell array 16. column decoder 14 selects one of column select lines CSL1 to CSLn according to the input internal column address signal, and sets it at a high potential. Column selector 18 selects one of bit lines BL1 to BLn on the basis of the selected column select line, and connects the selected bit line to bus 19.

In the program mode, input data is input to data input buffer 21, via data input pin 20. At this time, the output buffer section of data input buffer 21 is driven under control of power source voltage VP. Accordingly, data input buffer 21 sets bus 19 at "1" level, or voltage VP of 12.5 V, for example, or at "0" level of 0 V, for example. The output buffer section of column decoder 14 is also driven by power source voltage VP. Accordingly, one of column select lines CSL1 to CSLn is selected, and set at power source voltage VP. The bit line corresponding to the selected column select line is connected to bus line 19 by column selector 18. Under this condition, the potential on bus 19 is transferred to the selected bit line, so that the bit line is set at voltage VP or 0 V. Since the output buffer section of row decoder 13 is driven under power source voltage VP, when one of word lines WL1 to WLm is selected, the selected word line is set at voltage VP. Under this condition, when bus 19 has been set at voltage VP by data input buffer 21, voltage VP is applied to the control gate and the drain of the cell transistor, which is located at the intersection of the selected bit and word lines. As a result, electrons are injected into the floating gate of the cell transistor, so that the transistor stores data "1". When bus 19 is set at 0 V, voltage VP is applied to the control gate of the cell transistor at the intersection of the selected bit and word lines. At this time, the drain of the transistor has been at 0 V. Accordingly, no electrons are injected into the floating gate. Under this condition, the cell transistor stores data "0".

In a read mode, the output of data input buffer 21 is at high impedance. Data input buffer 21 is electrically separated from bus 19. Bus 19 is charged to voltage VC* by load circuit 22. When row decoder 13 selects one of word lines WS1 to WSm, the output buffer section of the row decoder has been driven by power source voltage VC. Therefore, the selected word line is placed at voltage VC. The output buffer section of column decoder 14 is also driven by this voltage VC. When column decoder 14 selects one of column select lines CSL1 to CSLn, it is placed at voltage VC. The result is the bit line corresponding to the selected column select line is made continuous to bus 19 by column selector 18.

In a read mode, bus 19 is set at a potential according to the data stored in the selected cell transistor, that is, the transistor located at the intersection of the selected bit and word lines. Specifically, according to the data, bus 19 maintains voltage VC* or is discharged through the selected cell transistor to be set at a potential lower than voltage VC*. The potential on bus 19 is detected by sense amplifier 23, and output to the exterior through data output buffer 24 and data output terminal 25.

As seen from the foregoing, the programmable ROM as discussed above is provided with internal power source voltage generator 27 for generating power source voltage VC*, which is substantially equal to or lower than power source voltage VC. Provision of this generator 27 eliminates the need for the power source terminal to which power source voltage VC is constantly applied. Accordingly, except for the ground terminal coupled with earth point, the only power source terminal required for the semiconductor chip is power source terminal 26 to which power source voltage VP or VC is selectively applied. Thus, when this programmable ROM is integrated into the semiconductor chip, the number of necessary pins may be reduced by one.

Turning now to FIG. 2, there is shown a specific circuit arrangement of internal power source generator 27, which may be used by the programmable memory according to the embodiment as mentioned above. In the circuit, the gate and the source of N channel depletion-mode (D-mode) MOS transistor 31 are interconnected. The drain of the transistor is connected to power source terminal 26 coupled for reception with power source voltage VP or VC (see FIg. 1). N channel enhancement-mode (E-mode) MOS transistor 32 is connected at the drain to the source of transistor 31. The source-drain paths of N channel E-mode MOS transistors 33 to 36 are connected in series between the source of transistor 32 and a ground terminal. The gate and the drain of each of these four transistors are interconnected. The gate of transistor 32 is connected to output node 37 for providing power source voltage VC*. N channel D-mode MOS transistor 38 is additionally provided and connected at the drain-source path between node 37 and power source terminal 26. The gate of transistor 38 is connected to the drain of transistor 32.

In the internal power source voltage generator thus arranged, the following relation holds between the threshold voltage VthD of the N channel D-mode MOS transistors and the threshold voltage VthE of N channel E-mode MOS transistor:

$$|VthE| < |VthD|$$

If the conductance of transistor 31 is satisfactorily small, the potential at output node 37, i.e., the internal power source voltage VC*, is given by the following relation irrespective of the value of the voltage applied to power source terminal 26, that is, VP of 12.5 V or VC of 5 V.

$$4Vth + Vth32 < VC^* < 4Vth + |VthD|.$$

where 4Vth is the sum of the threshold voltages VthE of four transistors 33 to 36, Vth32 is the threshold voltage of transistor 32, and $|VthD|$ is an absolute value of the threshold voltage of transistor 38. As seen from the above relation, if the threshold voltage of each transistor is properly adjusted, internal power source voltage VC* may be set at a value substantially equal to or lower than that of the power source voltage VC of 5 V, at which level the peripheral circuits properly operate. Further, voltage VC* may be kept almost constant against any variation of the current flowing out of node 37.

Another circuit arrangement of internal power source voltage generator 27 is shown in FIG. 3. This generator 27 is so arranged that the internal power source voltage VC* generated in response to voltage VP externally applied to power source terminal 26 is lower than the internal power source voltage VC* generated in response to voltage VC. The source-drain paths of N channel E-mode MOS transistors 42 to 44 are connected in series between node 41 and power source terminal 26 applied with voltage VP or VC. The gate and the drain of each of the three transistors are interconnected. N channel D-mode MOS transistor 45 is provided, and at the drain-source path between node 41 and the ground terminal. The gate of this transistor 45 is connected to the ground terminal. Node 41 is connected to three CMOS inverter 46 to 48, which are cascade connected to one another. These inverters are driven under the voltage VP or VC applied to power source terminal 26. The output node 49 of inverter 48 at the final stage is connected to the gate of N channel D-mode MOS transistor 50. The drain of this transistor 50 is connected to power source terminal 26. The source is connected to the output node 37 for outputting internal power source voltage VC*.

In the internal power source voltage generator thus arranged, the power source voltage applied to power source terminal 26 is dropped across three transistors 42 to 44 by a given voltage. The dropped voltage appears at node 41. When internal power source voltage VP is applied to power source terminal 26, a logical level at node 41 is "1". In turn, a "0" signal denoted as $\overline{PGM}$ appears at the output node 49 of inverter 48. When this signal is applied to the gate of transistor 50, output node 37 has internal power source voltage VC*, which is set at a value almost equal to the absolute value, e.g., 2 V to 3 V, of the threshold voltage of N channel D-mode MOS transistor 50.

Generally, a high speed response is not required during operation of the memory device in a program mode. The internal power source voltage VC* is enough to operate the peripheral CMO circuits.

In a read mode, power source voltage VC is applied to power source terminal 26. The potential at node 41 is "0" in level, and the $\overline{PGM}$ signal is "1" in level. Output node 37 has internal power source voltage VC* equal to power source voltage VC. As a result, in this mode, the peripheral circuits may be operated at a high speed.

Figure 4:
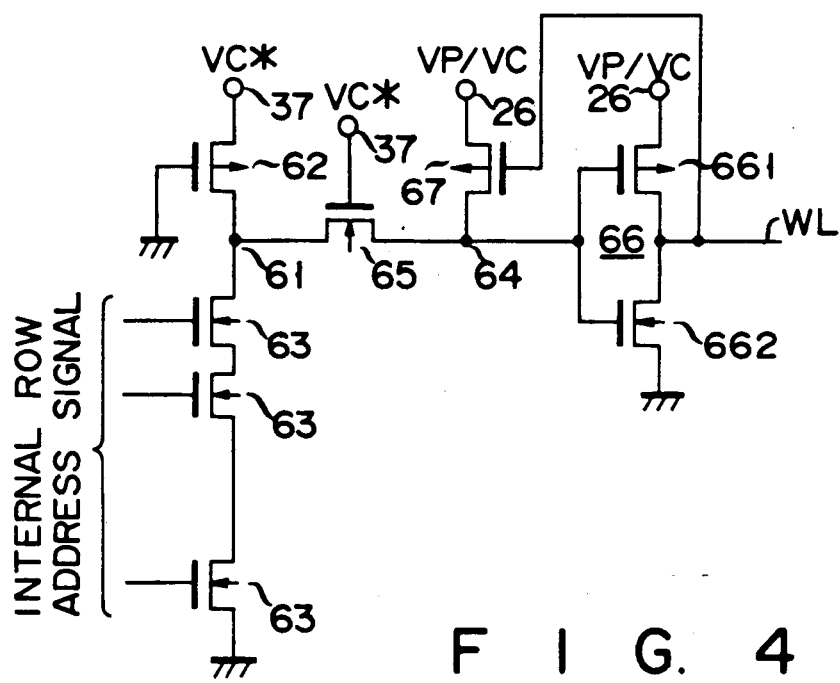
FIG. 4 is a circuit diagram showing a row decoder of one row contained in the FIG. 1 programmable ROM.

Reference is made to FIg. 4, in which is shown a circuit diagram showing in detail an arrangement of row decoder 13 shown in FIG. 1. For ease of explanation, the circuit arrangement illustrated is limited to one row, or one word line. Decoder 13 is driven by the internal power source voltage VC* appearing at output node 37 of the internal power source voltage generator and the power source voltage VP or VC applied to power source terminal 26. The source-drain path of P channel MOS transistor 62 as a load element is connected between nodes 37 and 61. The gate of this transistor 62 is connected to the ground terminal. A plurality of N channel MOS transistors 63 are connected in series between node 61 and the ground terminal. Specifically, the drain-source paths of these transistors are connected in series. These transistors 63 are for decoding purposes. The gates of these transistors ar coupled for reception with internal row address signals from the row address buffers, respectively. N channel MOS transistor 65 is connected at the drain-source path between nodes 61 and 64. The gate of this transistor 65 is connected to node 37. Node 64 is connected to input node of CMOS inverter 66, which is driven under the power source voltage VP or VC applied to power source terminal 26. The output node of inverter 66 is connected to one word line WL associated with it. The drain-source path of P channel MOS transistor 67 is inserted between node 64 and power source terminal 26. The gate of transistor 67 is connected to the corresponding word line WL.

In the circuit arrangement described above, in response to the internal address signal, N channel transistors 63 are turned on or off. This switching state sets node 61 in "1" or "0" level. When this node 61 is set in "0" level, for example, a "1" signal appears at the output node of inverter 66, so that word line WL is activated. Thus, in a program mode, power voltage VP of 12.5 V, for example, is applied to power source terminal 26, and hence word line WL is also set at this voltage VP. In a read mode, power source voltage VC of 5 V, for example, is applied to power source terminal 26, and and hence word line W1 is placed at power source voltage VC.

In this circuit under discussion, the two transistors 661 and 662 making up CMOS inverter 66, and transistors 65, 67 are geometrically designed so as to have a longer channel, or a longer channel and a thicker gate insulating film than that of the remaining transistors. The design is made for the reason that the circuit portions including those transistors must withstand a high voltage. The circuit arrangement of FIG. 4 is correspondingly applicable for the column decoder of one column.

Figure 5:
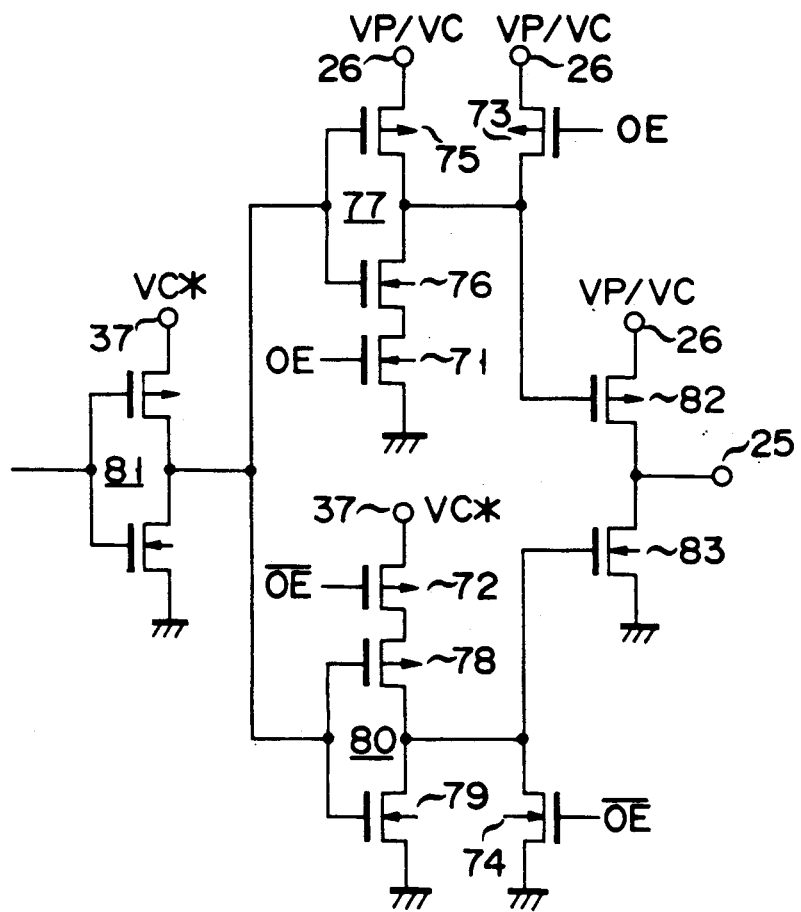
FIG. 5 is a circuit diagram showing an output buffer contained in the FIG. 1 programmable ROM.

A detailed circuit arrangement of the data output buffer 24, which is usable in the program ROM shown in FIG. 1, will be described referring to FIG. 5. This circuit is applied with output control signals OE and $\overline{OE}$ for controlling the outputting of data, in addition to the detected data output from sense amplifier 23 (FIG. 1). Generally, the program ROM is provided with a terminal for receiving output control signal $\overline{OE}$, although not shown in FIG. 1.

When output control signals OE and $\overline{OE}$ are "1" and "0", respectively, N channel MOS transistor 71 and P channel MOS transistor 72 are turned on, while P channel MOS transistor 73 and N channel MOS transistor 74 are turned off. Under this condition, CMOS gate circuit 77, which is made up of P channel MOS transistor 75, and two N channel MOS transistors 76 and 71, functions substantially as a CMOS inverter. CMOS gate circuit 80, which is made up of two P channel MOS transistors 72 and 78, and N channel MOS transistor 79, functions substantially as a CMOS inverter. The data from sense amplifier 23 is inverted by CMOS inverters 81 and 77 in a successive manner, and is then applied to the gate of P channel MOS transistor 82 at the output stage. The same is successively inverted by CMOS inverter 81 and 80, and is also applied to the gate of N channel MOS transistor 83 at the output stage. According to the contents of the detected data from sense amplifier 23, one of output transistors 82 and 83 is turned on. As a result, the data of "1" or "0" is output through terminal 25. Power source terminal 26 is connected to the source of output P channel MOS transistor 82, the source of the P channel MOS transistor 75 of CMOS gate circuit 77, and the source of the P channel MOS transistor 73 controlled by signal $\overline{OE}$. The reason why such connection is used, is that to obtain a higher current drive capability, the power source voltage externally applied to power source terminal 26 is preferable to the internal power source voltage VC* as generated by internal power source voltage generator 27.

Also in this circuit, each of the transistors 71, 73, 75, 76, 82, and 83 contained in the circuit portions connecting to power source terminal 26 has a longer channel, or a longer channel and a thicker gate insulating film than those of other circuit portions.

FIG. 6 shows a circuit diagram of another arrangement of data output buffer 24. This circuit also receives output control signal $\overline{OE}$, in addition to the data output from sense amplifier 23. An output control signal $\overline{OE}$ is "0", P channel MOS transistors 91 and 92 are turned on, while N channel MOS transistors 93 and 94 are turned off. Under this condition, CMOS gate circuits 97 and 100 serve substantially as inverters, respectively. As shown, CMOS gate circuit 97 is composed of P channel MOS transistors 91 and 95, and N channel MOS transistors 93 and 96. CMOS gate circuit 100 is composed of P channel MOS transistors 92 and 98, and N channel MOS transistors 94 and 99. The data sensed by sense amplifier 23 is successively inverted by CMOS inverters 100 and 102, and CMOS gate circuit 97, and is applied to the gate of output N channel MOS transistor 103. The same goes through another route. Specifically, it is inverted by CMOS inverter 101 and CMOS gate circuit 100, and applied to the gate of output N channel MOS transistor 104. According to the contents of the data from sense amplifier 23, one of the two n channel transistors 103 and 104 at the output stage is turned on. In turn, the output data of "1" or "0" is output through terminal 25.

This output buffer including the output stage is constructed with N channel transistors. The prestage inverters 101 and 102, and COMS gate circuits 97 and 100 may be operated by internal power source voltage VC*. Accordingly, the transistors that need to have a long channel length or a long channel and a thick gate insulating film are only two transistors 103 and 104.

It should be understood that this invention is not limited to the specific embodiments as mentioned above, but it may be variously changed or modified within the spirits and scope of the present invention. For example, in the programmable ROM thus far described, the program and read operations are serially performed with one-bit data. If necessary, those operations may be performed in parallel fashion, with n-bit data. Although the invention has been described illustrating no specific circuits of address input buffers 101 to 10n, 121 to 12m, column selector 18, data input buffer 21, load circuit 22, and sense amplifier 23, any suitable known circuits may be used for these circuits.

What is claimed is:

1. A programmable ROM integrated on a single semiconductor chip, comprising:
   a single power source supply terminal and a ground potential supply terminal, said power source supply terminal receiving an external first supply potential in a read mode and an external second supply potential in a program mode, the second supply potential being higher than the first supply potential;

internal supply potential generating means, connected to the power source supply terminal, for generating an internal supply potential, the internal supply potential being lower than the second supply potential in the program mode;

a first type circuit supplied with the internal supply potential so as not to be damaged by the high potential of the second supply potential in the program mode;

a second type circuit supplied with the first and second supply potentials; and a memory cell array including a plurality of memory cells, each of the memory cells being a CMOS transistor with a floating gate, the memory cell being programmed by the second type circuit, and data stored in the memory cell being detected by a sense amplifier of the first type circuit.

2. A programmable ROM according to claim 1, in which said internal supply potential generating means generates the internal supply potential having a value substantially equal to that of said first supply potential.

3. A programmable ROM according to claim 1, in which said internal supply potential generating means generates the internal supply potential having a level lower than that of said first supply potential.

4. A programmable ROM according to claim 2 or 3, in which said second type circuit is supplied with said first supply potential and said internal supply potential as drive power sources when said programmable ROM is in a read mode, and said second type circuit is supplied with said second supply potential and said internal supply potential as drive power sources when said programmable ROM is in a program mode.

5. A programmable ROM according to claim 2 or 3, in which said second type circuit includes a row decoder and a column decoder.

6. A programmable ROM according to claim 5, in which said row decoder and said column decoder include output buffer sections, respectively, and said output buffer sections are connected to said power source supply terminal in a manner that said output buffer sections are supplied with said first supply potential when said programmable ROM is in a read mode, and are supplied with said second supply potential when said programmable ROM is in a program mode.

7. A programmable ROM according to claim 6, in which said buffer sections are each constructed with transistors whose channel length is longer than that of the transistors contained in other circuit sections of said row decoder and said column decoder.

8. A programmable ROM according to claim 2 or 3, in which said second type circuit includes a data output buffer.

9. A programmable ROM according to claim 1, in which said internal supply potential generating means generates the internal supply potential having a value that is invariable in both read and program modes.

10. A programmable ROM according to claim 1, in which said internal supply potential generating means generates the internal supply potential having a value in a program mode that is lower than that in a read mode.

11. A programmable ROM according to claim 1, in which said internal supply potential generating means includes first, second, and third transistors, and a constant voltage generator, said first transistor is an N channel depletion-mode transistor having a drain connected to said power source supply terminal, and a gate and a source both being interconnected, said second transistor is an N channel enhancement-mode transistor having a drain connecting to the source of said first transistor, a gate connecting to an internal supply potential output node, and a source, said constant voltage generator is connected between the source of said second transistor and the ground potential supply terminal, said third transistor is an N channel depletion-mode transistor having a drain connecting to said power source supply terminal, a gate connecting to the source of said first transistor, and a source connecting to said internal supply potential generating node.

12. A programmable ROM according to claim 11, in which said constant voltage generator includes a plurality of N channel enchancement-mode transistors each having a drain and a source both being interconnected, the drain-source paths of said transistors being connected in series.

13. A programmable ROM according to claim 1, in which said internal supply potential generating means includes a constant voltage dropping circuit for dropping the supply potential applied to said power source supply terminal by a given voltage, a CMOS inverter circuit supplied with a drive power source voltage of the supply potential applied to said power source supply terminal, said CMOS inverter being inputted with the output voltage from said constant voltage dropping circuit, and an N channel depletion-mode transistor having a drain connecting to said power source supply terminal, a gate connecting to the output of said CMOS inverter circuit, and a source connecting to an internal power source voltage generation node.

14. A programmable ROM according to claim 13, in which said constant voltage dropping circuit includes a plurality of N channel enhancement-mode transistors each having a drain and a gate both being interconnected, and the drain-source paths of said transistors are connected in series.

* * * * *